US007915820B2

(12) United States Patent
Lee et al.

(10) Patent No.: US 7,915,820 B2
(45) Date of Patent: Mar. 29, 2011

(54) DISPLAY DEVICE AND METHOD OF MANUFACTURING THE SAME

(75) Inventors: Sang-Pil Lee, Seoul (KR); Un-cheol Sung, Anyang-si (KR); Hoon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 789 days.

(21) Appl. No.: 11/689,201

(22) Filed: Mar. 21, 2007

(65) Prior Publication Data

US 2007/0222368 A1    Sep. 27, 2007

(30) Foreign Application Priority Data

Mar. 21, 2006   (KR) .................. 10-2006-0025835

(51) Int. Cl.
*H05B 33/00* (2006.01)
*H01L 51/50* (2006.01)
(52) U.S. Cl. ........................ 313/509; 313/506
(58) Field of Classification Search .................. 313/506, 313/509
See application file for complete search history.

(56) References Cited

U.S. PATENT DOCUMENTS

| | | | | |
|---|---|---|---|---|
| 5,814,416 A | * | 9/1998 | Dodabalapur et al. | 428/690 |
| 6,741,228 B1 | * | 5/2004 | Yokoyama et al. | 345/76 |
| 2004/0195963 A1 | * | 10/2004 | Choi et al. | 313/504 |
| 2005/0073230 A1 | * | 4/2005 | Nishikawa et al. | 313/111 |
| 2006/0119251 A1 | * | 6/2006 | Kim | 313/500 |

FOREIGN PATENT DOCUMENTS

| | | |
|---|---|---|
| JP | 2005-276446 | 10/2005 |
| KR | 1020050026845 A | 3/2005 |
| KR | 1020050112034 A | 11/2005 |

* cited by examiner

*Primary Examiner* — Nimeshkumar D Patel
*Assistant Examiner* — Anthony T Perry
(74) *Attorney, Agent, or Firm* — Cantor Colburn LLP

(57) ABSTRACT

An exemplary embodiment of a display device includes a substrate, a transistor disposed on the substrate, a passivation layer which substantially covers the transistor, an organic layer disposed on the passivation layer which generates light to an outside, and a light efficiency improving layer including a first inorganic layer and a second inorganic layer which are sequentially disposed between the organic layer and the outside.

7 Claims, 12 Drawing Sheets

DISPLAY DEVICE AND METHOD OF MANUFACTURING THE SAME

This application claims priority to Korean Patent Application No. 2006-0025835, filed on Mar. 21, 2006, and all the benefits accruing therefrom under 35 U.S.C. §119, the contents of which in its entirety are herein incorporated by reference.

BACKGROUND OF THE INVENTION

1. Field of the Invention

The present invention relates to a display device and a method of manufacturing the same, and more particularly, to a display device having improved light efficiency and color purity and a method of manufacturing the same.

2. Description of the Related Art

Recently, organic light emitting diode ("OLED") display devices have attracted attention and interest in the industry of flat panel display devices because of their low-power requirements, light weight, slim shape, wide viewing angle, high-speed response and other positive attributes.

An OLED display includes an insulating substrate, a thin film transistor ("TFT") provided on the insulating substrate, a pixel electrode connected to the TFT, a wall partitioning the pixel electrodes, an organic layer formed on the pixel electrode between the walls, and a common electrode formed on the wall and the organic layer.

The TFT controls the emission of light from a light emitting layer in each individual pixel region. A pixel electrode is disposed in each pixel region to form an individual pixel. Each pixel electrode is electrically isolated from its neighboring pixel electrodes so it may be driven independently from surrounding pixel electrodes. The wall between the neighboring pixel regions is formed to be higher than the pixel electrodes. The wall prevents short-circuits between the pixel electrodes and isolates each pixel region. An organic layer including a hole injecting layer and a light emitting layer is formed on the pixel electrode between the walls. The OLED display device with the aforementioned configuration displays images by controlling light generated from the light emitting layer in each pixel region.

The light generated from the light emitting layer passes through a plurality of layers to be emitted outside of the OLED display device. However, while passing through the plurality of layers the light is scattered as each layer has a different degree of refractivity, thereby deteriorating light efficiency and color purity of the emitted light. One method of overcoming this deterioration is to emit light with a high degree of brightness. However, power consumption increases and the light emitting layer deteriorates more rapidly when a light with a high degree of brightness is emitted.

BRIEF SUMMARY OF THE INVENTION

Accordingly, it is an aspect of the present invention to provide a display device having improved light efficiency and color purity.

Another aspect of the present invention is to provide a method of manufacturing a display device having improved light efficiency and color purity.

An exemplary embodiment of a display device includes; a substrate, a transistor disposed on the substrate, a passivation layer which substantially covers the transistor, an organic layer disposed on the passivation layer which generates light to an outside, and a light efficiency improving layer including a first inorganic layer and a second inorganic layer which are sequentially disposed between the organic layer and the outside.

According to an exemplary embodiment of the present invention the second inorganic layer has a higher refractivity than the first inorganic layer.

According to an exemplary embodiment of the present invention the first inorganic layer and the second inorganic layer contact each other.

According to an exemplary embodiment of the present invention, the first inorganic layer includes silicon oxide ("SiOx"), and the second inorganic layer comprises silicon nitride ("SiNx").

According to an exemplary embodiment of the present invention, the thickness of the first inorganic layer is between about 880 Å and about 1000 Å, and the thickness of the second inorganic layer is between about 600 Å and about 700 Å.

According to an exemplary embodiment of the present invention, the display device further includes a pixel electrode disposed between the passivation layer and the organic layer, wherein the light efficiency improving layer is disposed between the passivation layer and the pixel electrode.

According to an exemplary embodiment of the present invention, the passivation layer comprises an inorganic passivation layer and an organic passivation layer which is disposed further from the substrate than the inorganic passivation layer, wherein the light efficiency improving layer is disposed between the organic passivation layer and the inorganic passivation layer.

According to an exemplary embodiment of the present invention, the display device further includes a wall disposed on the passivation layer which partitions the pixel electrodes, and a common electrode which substantially covers the wall and the organic layer, wherein the light efficiency improving layer is disposed on the common electrode.

According to an exemplary embodiment of the present invention, the organic layer includes a red organic light emitting layer, a green organic light emitting layer and a blue organic light emitting layer, and the light efficiency improving layer includes a plurality of sections corresponding to the red, green and blue organic light emitting layers, respectively, and at least one of the plurality of sections has a thickness which differs from the other sections.

According to an exemplary embodiment of the present invention, the organic layer includes a red organic light emitting layer, a green organic light emitting layer and a blue organic light emitting layer, the light efficiency improving layer includes a plurality of sections corresponding to the red, green and blue organic light emitting layers, respectively, and at least one of the plurality of sections covers a different sizes area.

An exemplary embodiment of a display device includes; a transistor disposed on a substrate, an inorganic passivation layer which substantially covers the transistor, a color filter layer disposed on the inorganic passivation layer, an organic passivation layer which substantially covers the color filter layer, a light efficiency improving layer which includes a first inorganic layer and a second inorganic layer which are sequentially disposed on the organic passivation layer, and a pixel electrode and an organic layer which are sequentially disposed on the light efficiency improving layer.

According to an exemplary embodiment of the present invention, the second inorganic layer has a higher refractivity than the first inorganic layer.

According to an exemplary embodiment of the present invention, the first inorganic layer and the second inorganic layer contact each other, and the first inorganic layer includes silicon oxide ("SiOx") and the second inorganic layer includes silicon nitride ("SiNx").

According to an exemplary embodiment of the present invention, the thickness of the first inorganic layer is between about 880 Å and about 1000 Å, and the thickness of the second inorganic layer is between about 600 Å and about 700 Å.

According to an exemplary embodiment of the present invention, the organic layer emits white light.

According to an exemplary embodiment of the present invention, the color filter layer includes a red color filter layer, a green color filter layer and a blue color filter layer, and at least one portion of the light efficiency improving layer includes a plurality of sections corresponding to the red, green and blue organic light emitting layers, respectively, and at least one of the plurality of sections has a thickness which differs from the other sections.

According to an exemplary embodiment of the present invention, the color filter layer includes a red color filter layer, a green color filter layer and a blue color filter layer, and at least one portion of the light efficiency improving layer includes a plurality of sections corresponding to the red, green and blue organic light emitting layers, respectively, and at least one of the plurality of sections covers a different sized area.

An exemplary embodiment of a display device includes; a transistor disposed on an insulating substrate, a passivation layer which substantially covers the transistor, a pixel electrode disposed on the passivation layer, a wall which divides the pixel electrodes, an organic layer disposed on the pixel electrode between the walls, a common electrode which substantially covers the organic layer and the wall, a light efficiency improving layer including a first inorganic layer and a second inorganic layer which are sequentially disposed on the common electrode between the walls, and a color filter layer disposed on the light efficiency improving layer.

According to an exemplary embodiment of the present invention, the second inorganic layer has a higher refractivity than the first inorganic layer.

According to an exemplary embodiment of the present invention, at least one of the first inorganic layer and the second inorganic layer includes multiple layers.

An exemplary embodiment of a method of manufacturing a display device includes sequentially disposing a plurality of transistors and a passivation layer on a substrate, the passivation layer substantially covering the transistors, sequentially disposing a first inorganic layer and a second inorganic layer on the passivation layer, patterning the first inorganic layer and the second inorganic layer to be disposed between the transistors, disposing a pixel electrode on the first and second inorganic layer, disposing an organic layer on the pixel electrode, and disposing a common electrode on the organic layer.

According to an exemplary embodiment of the present invention, the second inorganic layer is formed to have a higher refractivity than the first inorganic layer.

According to an exemplary embodiment of the present invention, the first inorganic layer and the second inorganic layer are patterned at substantially the same time.

According to an exemplary embodiment of the present invention, the first inorganic layer includes silicon oxide ("SiOx"), and the second inorganic layer includes silicon nitride ("SiNx"), and the thickness of the first inorganic layer is between about 880 Å and about 1000 Å, and the thickness of the second inorganic layer is between about 600 Å and about 700 Å.

According to an exemplary embodiment of the present invention, the method of manufacturing further includes disposing a color filter layer which at least partially overlaps with the organic layer between the transistors and the passivation layer.

According to an exemplary embodiment of the present invention, the organic layer emits white light.

BRIEF DESCRIPTION OF THE DRAWINGS

The above and/or other aspects and advantages of the present invention will become more readily apparent and appreciated in light of the following description of the exemplary embodiments, taken in conjunction with the accompanying drawings of which.

DETAILED DESCRIPTION OF THE INVENTION

Figure 1:
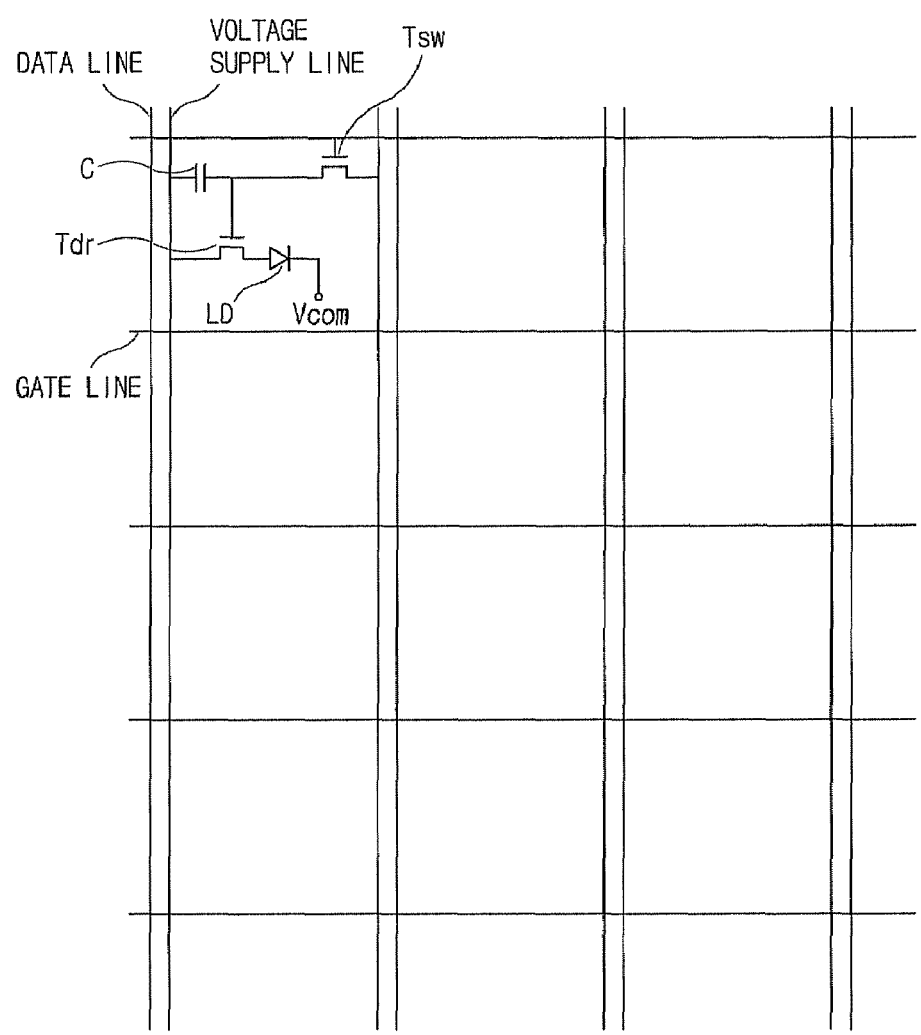
FIG. 1 is an equivalent circuit diagram of a first exemplary embodiment of a display device according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

FIG. 1 is an equivalent circuit diagram of a first exemplary embodiment of a display device according to the present invention.

Referring to FIG. 1, one exemplary embodiment of a pixel in the first exemplary embodiment of a display device according to the present invention comprises a plurality of signal lines. The signal lines comprise a gate line transmitting a scanning signal, a data line transmitting a data signal and a voltage supply line transmitting a driving voltage. The data line and the voltage supply line are disposed substantially adjacently and substantially parallel to each other. The gate line extends substantially perpendicularly to the data line and the voltage supply line.

Each pixel comprises an organic light emitting element LD, a switching thin film transistor Tsw, a driving thin film transistor Tdr and a capacitor C.

The driving thin film transistor Tdr comprises a control terminal, an input terminal and an output terminal. The control terminal is connected to the switching thin film transistor Tsw, the input terminal is connected to the voltage supply line, and the output terminal is connected to the organic light emitting element LD.

The organic light emitting element LD comprises an anode connected to the output terminal of the driving thin film transistor Tdr and a cathode connected to a common voltage Vcom. The organic light emitting element LD emits light with a variable intensity depending on an output current from the driving thin film transistor Tdr applied thereto. A plurality of light emitting elements may be used together to display images. The intensity of the current from the driving thin film transistor Tdr varies depending on a voltage between the control terminal and the output terminal thereof.

The switching thin film transistor Tsw comprises a control terminal, an input terminal and an output terminal. The control terminal is connected to the gate line, the input terminal is connected to the data line, and the output terminal is connected to the control terminal of the driving thin film transistor Tdr. The switching thin film transistor Tsw transmits the data signal applied to the data line to the driving thin film transistor Tdr in response to the scanning signal applied to the gate line.

The capacitor C is connected between the control terminal of the driving thin film transistor Tdr and the input terminal thereof. The capacitor C is charged with a voltage corresponding to the data signal input to the control terminal of the driving thin film transistor Tdr and maintains the voltage during a light emitting time period.

To display moving images the display device rapidly displays a series of slightly changing images. The rapid display of these slightly varying images creates an illusion of movement. Each image is displayed for a short time period also referred to as a frame. In one exemplary embodiment the light emitting time period during which the capacitor maintains the voltage corresponding to the data signal may be one frame.

Figure 2:
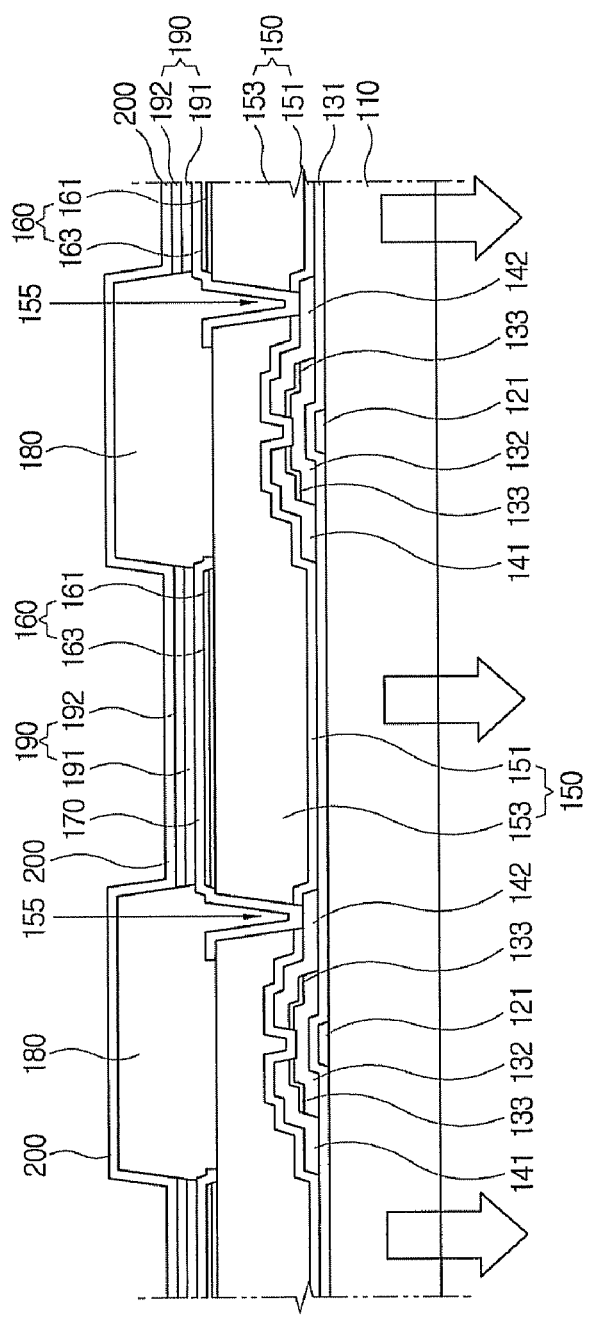
FIG. 2 is a cross-sectional view of the first exemplary embodiment of a display device according to the present invention.

Referring to FIG. 2, a cross-sectional view of the first exemplary embodiment of a display device according to the present invention will be described in detail. FIG. 2 shows only the driving thin film transistor Tdr without the switching thin film transistor Tsw.

A gate electrode 121 is formed on an insulating substrate 110, exemplary embodiments of which are made of glass, quartz, ceramic or plastic. A gate insulating layer 131, one exemplary embodiment of which is made of silicon nitride ("SiNx"), is formed on the insulating substrate 110 and the gate electrode 121.

A semiconductor layer 132 and an ohmic contact layer 133 are sequentially formed on the gate insulating layer 131 substantially above the gate electrode. In one exemplary embodiment the semiconductor layer 132 is made of amorphous silicon, and the ohmic contact layer 133 is made of n+ hydrogenated amorphous silicon which is highly doped with n-type impurities. The ohmic contact layer 133 is divided into two parts, the gate electrode 121 being disposed therebetween.

A source electrode 141 and a drain electrode 142 are formed on the ohmic contact layer 133 and the gate insulating layer 131. The source electrode 141 and the drain electrode 142 are separated from each other, the gate electrode 121 being disposed therebetween.

A passivation layer 150 is formed on the source electrode 141, the drain electrode 142 and the portion of the semiconductor layer 132 which is exposed between the source and drain electrodes 141 and 142. In one exemplary embodiment the passivation layer 150 may comprise an inorganic passivation layer 151 made of silicon nitride ("SiNx") and an organic passivation layer 153. In such an exemplary embodiment the organic material for the organic passivation layer 153 may include one of benzocyclobutene ("BCB"), olefin, acrylic resin, polyimde, Teflon™, Cytop™ and perfluorocyclobutene ("FCB"). In one exemplary embodiment a surface of the organic passivation layer 153 is substantially flat, a contact hole 155 is formed in the inorganic passivation layer 151 and the organic passivation layer 153 to expose a portion of the drain electrode 142.

A light efficiency improving layer 160 is formed on the organic passivation layer 153. In one exemplary embodiment the light efficiency improving layer 160 comprises a first inorganic layer 161 in the lower part thereof and a second inorganic layer 163 in the upper part thereof. The second inorganic layer 163 has a higher refractivity than the first inorganic layer 161 and contacts the first inorganic layer 161. In one exemplary embodiment the first inorganic layer 161 includes silicon oxide ("SiOx") and the second inorganic layer 163 includes silicon nitride ("SiNx"). The two inorganic layers 161 and 163 are substantially transparent.

In one exemplary embodiment the thickness of the first inorganic layer 161 may be between about 880 Å and about 1000 Å, and the thickness of the second inorganic layer 163 may be between about 600 Å and about 700 Å. The wavelength of light generated in an organic light emitting layer 192 is modified by the light efficiency improving layer 160, thereby improving light efficiency and color purity. The wavelength of the light may be desirably adjusted depending on the refractivities and thicknesses of the first and second inorganic layers 161 and 163.

In one exemplary embodiment the organic light emitting layer 192 comprises a plurality of differently colored light emitting layers 192 in different pixel regions. One exemplary embodiment of the different colors includes red, green and blue light emitting layers, each different colored light emitting layer disposed in a separate pixel region. In such an exemplary embodiment pixel regions including light emitting layers 192 emitting light of differing colors are disposed substantially adjacently to one another.

In another exemplary embodiment to be discussed below with reference to FIGS. 6 and 7 the light emitting layer 192 emits white light, either by including a white light emitting organic light emitting layer or by including a combination of red, green, and blue light emitting layers within a single pixel region. In such an exemplary embodiment the addition of a color filter becomes necessary in order to display colors. While a few exemplary embodiments of the light emitting layer have been disclosed above, the present invention is not limited thereto, but may include various alternative configurations.

The light efficiency improving layer 160 may be formed with a different thickness depending on which color light emitting layer 192 it is disposed to overlap. In the exemplary embodiment wherein the organic light emitting layer 192 comprises a red organic light emitting layer, a green organic light emitting layer and a blue organic light emitting layer at least one portion of the light efficiency improving layer 160 corresponding to the red, green and blue organic light emitting layers 192 may have a different thickness. For example, the three light efficiency improving layers 160 corresponding to the three colors may have three different thicknesses, or only one portion of the light efficiency improving layer 160 may have a different thickness from those of the other two portions.

Likewise, at least one portion of the light efficiency improving layer 160 corresponding to the red, green and blue organic light emitting layers 192 may cover a different sized area.

The light efficiency improving layer 160 modulated with the aforementioned exemplary configuration produces uniform light efficiency and/or color purity with respect to the different light emitting efficiency and color purity depending on the red, green and blue organic light emitting layers.

However, the light efficiency improving layer 160 may also deteriorate the light efficiency and the color purity of the light emitting layer 192 depending on the characteristics of the light emitting layer 192. In this case, a portion of the light efficiency improving layer 160 may be removed corresponding to the organic light emitting layer 192 where the light efficiency and the color purity has been lowered.

In one exemplary embodiment the area of the light efficiency improving layer 160 is substantially the same as or larger than the area of the light emitting layer 192.

A pixel electrode 170 is formed on the light efficiency improving layer 160. The pixel electrode 160 is referred to as an anode and provides holes to an organic layer 190. In one exemplary embodiment the pixel electrode 170 is made of a transparent conductive material such as indium tin oxide ("ITO") or indium zinc oxide ("IZO") and is connected to the drain electrode 142 through a contact hole 155.

A wall 180 is formed on the pixel electrode 170 and an organic passivation layer 153 which surrounds the pixel electrode 170 underneath the light emitting layer 192. The wall 180 partitions the pixel electrodes 170 to define a pixel region. The wall 180 provides additional space between the electrodes of the driving transistor, namely the source electrode 141 and the drain electrode 142 and a common electrode 200, which prevents short circuiting therebetween. In one exemplary embodiment the wall 180 is made of a photoresist material with thermal resistance and solvent resistance characteristics, exemplary embodiments of which include acrylic resin, polyimide resin, and various other similar materials; an inorganic material exemplary embodiments of which include $SiO_2$ and $TiO_2$; or double layers of an organic layer and an inorganic layer.

An organic layer 190 is formed on a portion of the pixel electrode 170 left uncovered by the formation of the wall 180. In one exemplary embodiment the organic layer 190 comprises a hole injecting layer 191 and the organic light emitting layer 192. Alternative exemplary embodiments include configurations wherein the organic layer 190 includes additional layers such as a hole transport layer (not shown), an electron injection layer (not shown), an electron transport layer (not shown), or various combinations of the above. Alternative exemplary embodiments also include configurations wherein only a light emitting layer is included.

The hole injecting layer 191 may include a hole injecting material exemplary embodiments of which include poly-3,4-ethylenedioxythiophene ("PEDOT"), poly styrenesulfonate acid ("PSS") or other similar materials and may be formed by ink-jetting the hole injecting material in an aqueous suspension state.

The organic light emitting layer 192 comprises the red organic light emitting layer, the green organic light emitting layer and the blue organic light emitting layer. Exemplary embodiments of the organic light emitting layer 192 may include polyfluorene derivatives, poly(p-paraphenylene vinylene) derivatives, polyphenylene derivatives, poly(vinylcarbazole) derivatives and poly thiophene derivatives; or compounds thereof doped with a perillene group pigment, rhodamine group pigment, rubrene, perillene, 9,10-diphenylanthracene, tetraphenylbutadiene, Nile red, cumarine 6, quinacridone, or other similar materials.

Holes provided from the pixel electrode 170 and electrons provided from the common electrode 200 are combined in the organic light emitting layer 192 to form excitons. The excitons generate light through their deactivation process.

The common electrode 200 is formed on the wall 180 and the organic light emitting layer 192. The common electrode 200 is referred to as a cathode and provides electrons to the organic light emitting layer 192. The common electrode 200 is made of an opaque material exemplary embodiments of which include aluminum, silver or other similar materials. Light emitted from the organic light emitting layer 192 exits toward the insulating substrate 110.

The display device described above is a bottom-emission type display wherein light from the organic light emitting layer 192 exits toward the insulating substrate 110. However, the display device may be a top-emission type display wherein the light from the organic light emitting layer 192 exits through the common electrode 200.

Hereinafter, an exemplary embodiment of a method of manufacturing the first exemplary embodiment of a display device according to the present invention will be described with reference FIGS. 3A through 3E.

Figure 3A:
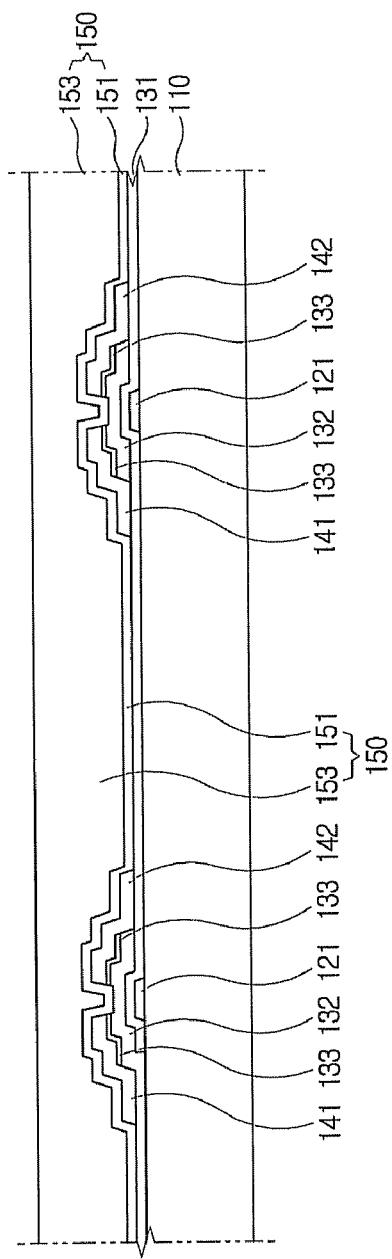
FIGS. 3A through 3E illustrate an exemplary embodiment of a method of manufacturing the display device according to the present invention.

Referring to FIG. 3A, the driving TFT Tdr, the inorganic passivation layer 151 covering the TFT and the organic passivation layer 153 are formed on the insulating substrate 110. The driving TFT Tdr is formed by any of several well known methods, and the inorganic passivation layer 151 is formed on the driving TFT Tdr. In one exemplary embodiment the inorganic passivation layer 151 is formed by chemical vapor deposition of silicon nitride. The organic passivation layer 153 is formed by spin coating, slit coating, screen printing, or other similar techniques.

Figure 3B:
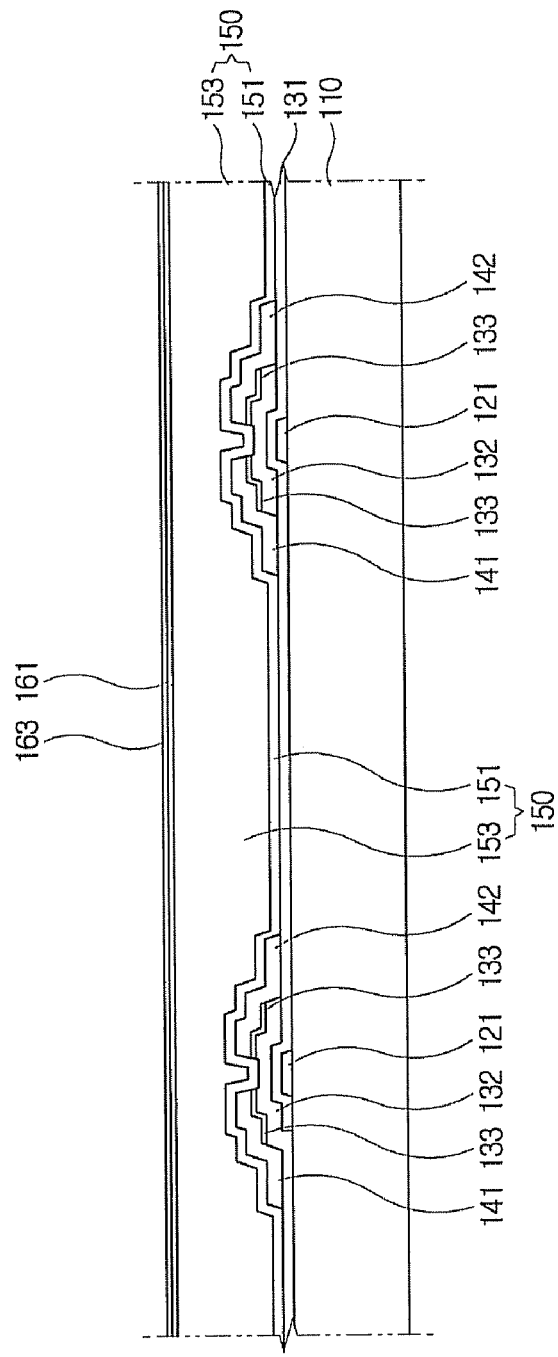

Referring to FIG. 3B, the first inorganic layer 161, exemplary embodiments of which include silicon oxide, and the second inorganic layer 163, exemplary embodiments of which include silicon nitride, are sequentially formed on the surface of the organic passivation layer 153. In one exemplary embodiment they may be formed by chemical vapor deposition. In the present exemplary embodiment, other elements do not intervene between the first inorganic layer 161 and the second inorganic layer 163, and the second inorganic layer 163 has a higher refractivity than the first inorganic layer 161. According to the present exemplary embodiment the thickness of the first inorganic layer 161 may be between about 880 Å and about 1000 Å, and the thickness of the second inorganic layer 163 may be between about 600 Å and about 700 Å.

Figure 3C:
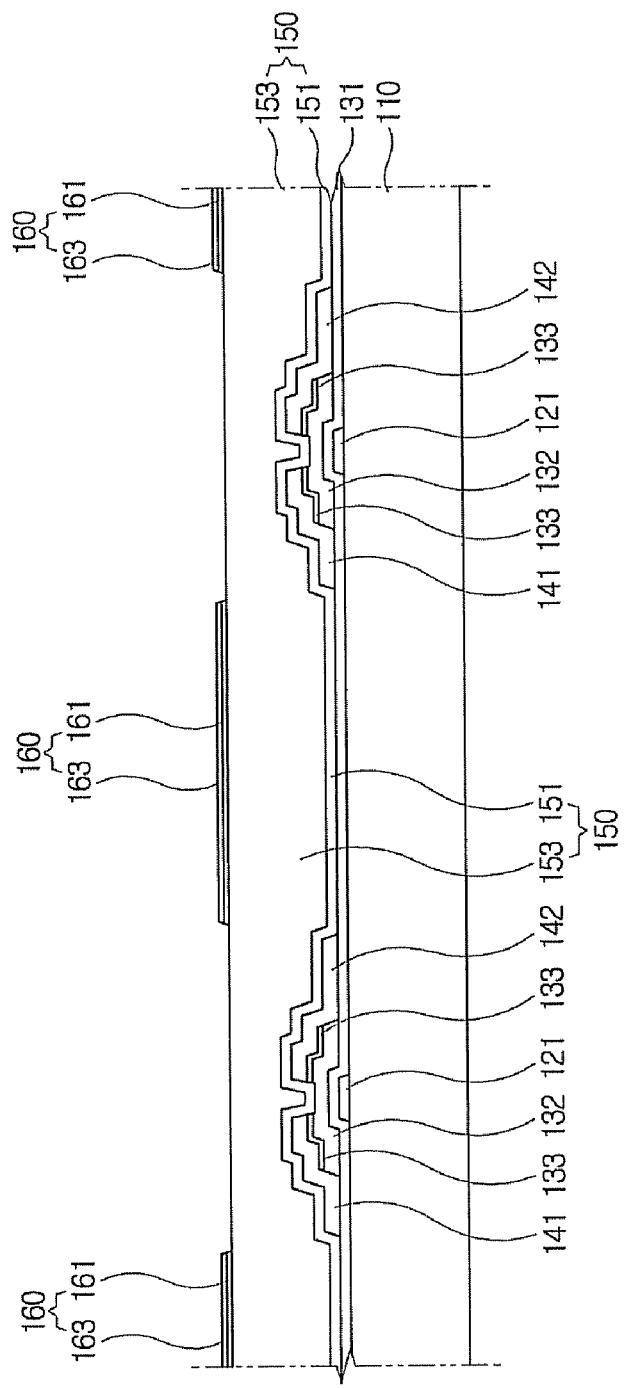

Referring to FIG. 3C, the first inorganic layer 161 and the second inorganic layer 163 are patterned to correspond to a display region, thereby forming the light efficiency improving layer 160. In the present exemplary embodiment the patterning may be performed by photolithography. The light efficiency improving layer 160 may be formed into a plurality of sections to correspond to the organic layer 190 between the walls 180. In the present exemplary embodiment, the first inorganic layer 161 and the second inorganic layer 163 are patterned at the same time.

The light efficiency improving layer 160 may be formed with different thicknesses depending on its location. The organic light emitting layer 192 comprises a red organic light emitting layer, a green organic light emitting layer and a blue organic light emitting layer, and at least one section of the light efficiency improving layer 160 corresponding to the red, green and blue organic light emitting layers 192 may have a different thickness. For example, the three sections of the light efficiency improving layer 160 corresponding to the three colors may have three different thicknesses, or only one portion of the light efficiency improving layer 160 may have a different thickness from those of the other two portions.

Likewise, at least one portion of the light efficiency improving layer 160 among the three sections corresponding to the red, green and blue organic light emitting layers 192 may cover a different sized area.

The light efficiency improving layer 160 with the aforementioned configuration achieves more uniform light emitting efficiency and/or color purity throughout the entire display as the light emitting efficiency and the color purity may vary depending on the red, green and blue organic light emitting layers.

However, the light efficiency improving layer 160 may also deteriorate the light efficiency and the color purity of the light emitting layer 192 depending on the characteristics of the light emitting layer 192. In this case, a portion of the light efficiency improving layer 160 may be removed corresponding to a portion of the organic light emitting layer 192 where the light efficiency and the color purity have been lowered.

In another exemplary embodiment the area of the light efficiency improving layer 160 is substantially the same as or larger than the area of the light emitting layer 192.

Figure 3D:
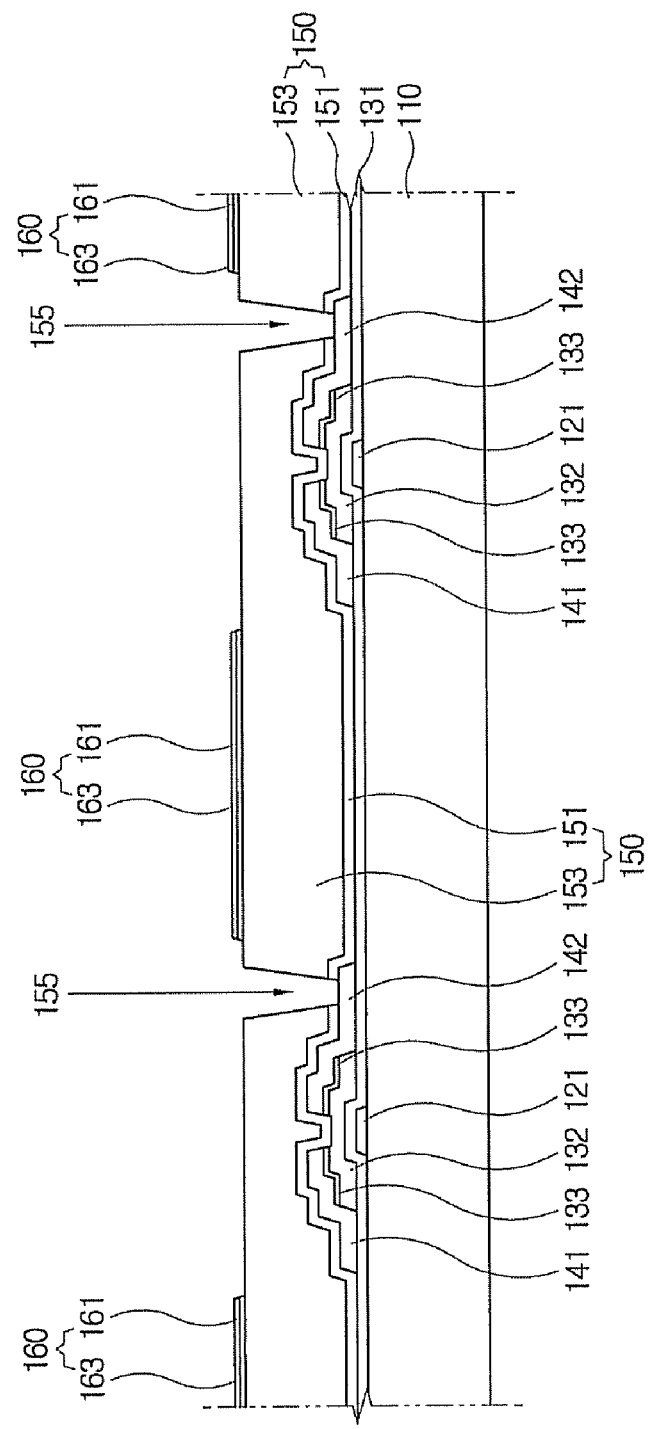

Referring to FIG. 3D, the contact hole 155 is formed in the inorganic passivation layer 151 and the organic passivation layer 153 to expose a portion of the drain electrode 142. The contact hole 155 may be formed by any of several well-known methods.

Figure 3E:
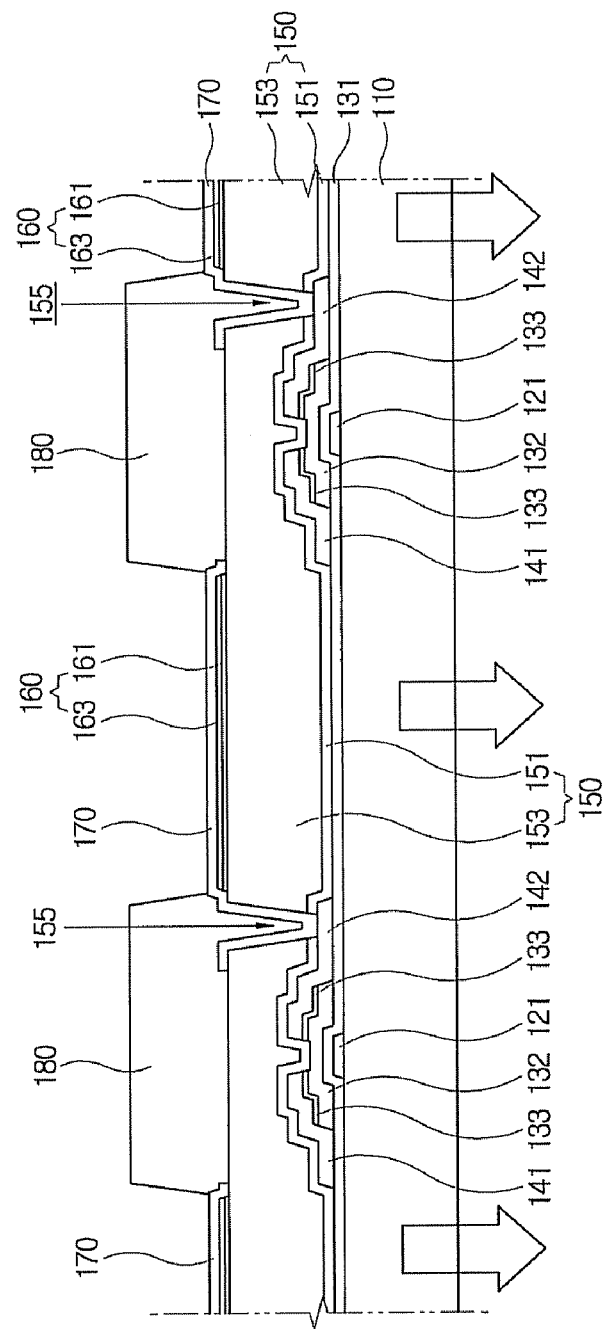

Referring to FIG. 3E, the pixel electrode 170 and the wall 180 are formed by any of several well-known methods. The pixel electrode 170 contacts the drain electrode 142 through the contact hole 155 and substantially covers the light efficiency improving layer 160. The wall 180 partitions the pixel electrodes 170 to define the pixel region.

The organic layer 190 and the common electrode 200 are formed by any of several well-known methods, thereby completing the exemplary embodiment of an OLED display shown in FIG. 2.

Hereinafter, second through sixth exemplary embodiments of a display device according to the present invention will be described with reference to FIGS. 4 through 8. It should be noted that the following description will be made with particular emphasis given to the features which differentiate the second through sixth exemplary embodiments from those of the first exemplary embodiment.

Figure 4:
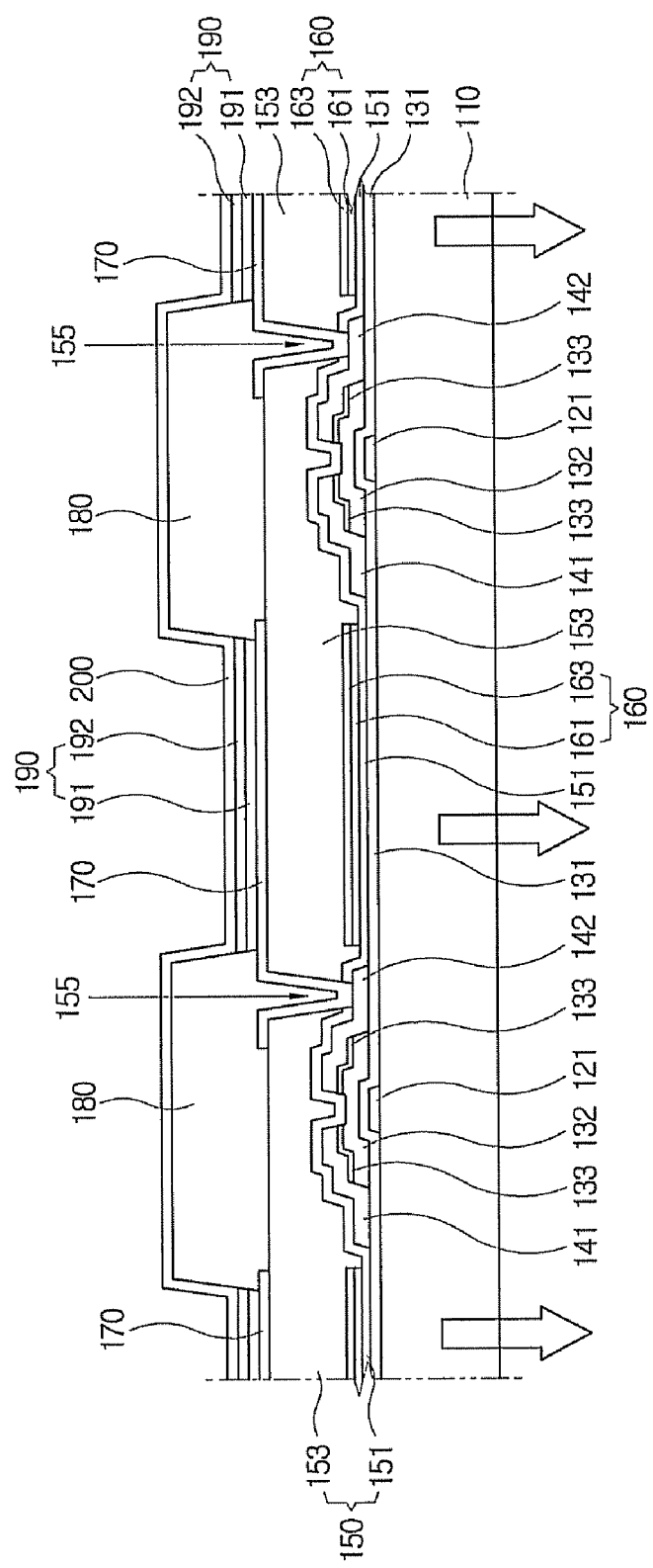
FIGS. 4 through 8 are cross-sectional views of second through sixth exemplary embodiments of a display device according to the present invention, respectively.

FIG. 4 is a cross-sectional view of second exemplary embodiment of an OLED display according to the present invention. The second exemplary embodiment of an OLED display is bottom-emission type display as has been described above. A light efficiency improving layer 160 is disposed between an organic passivation layer 153 and an inorganic passivation layer 151. In such an exemplary embodiment, a first inorganic layer 161 and a second inorganic layer 163 of the light efficiency improving layer 160 are sequentially formed after the inorganic passivation layer 151 covering a driving TFT Tdr is formed. Then, the first inorganic layer 161 and the second inorganic layer 163 are patterned to correspond to an organic layer 190, thereby completing the light efficiency improving layer 160. The organic passivation layer 153 is formed to cover the inorganic passivation layer 151 and the light efficiency improving layer 160. A contact hole 155 is formed in the inorganic passivation layer 151 and the organic passivation layer 153 to expose a portion of a drain electrode 142. In another exemplary embodiment the light efficiency improving layer 160 may be also formed between a gate insulating layer 131 and the inorganic passivation layer 151.

Figure 5:
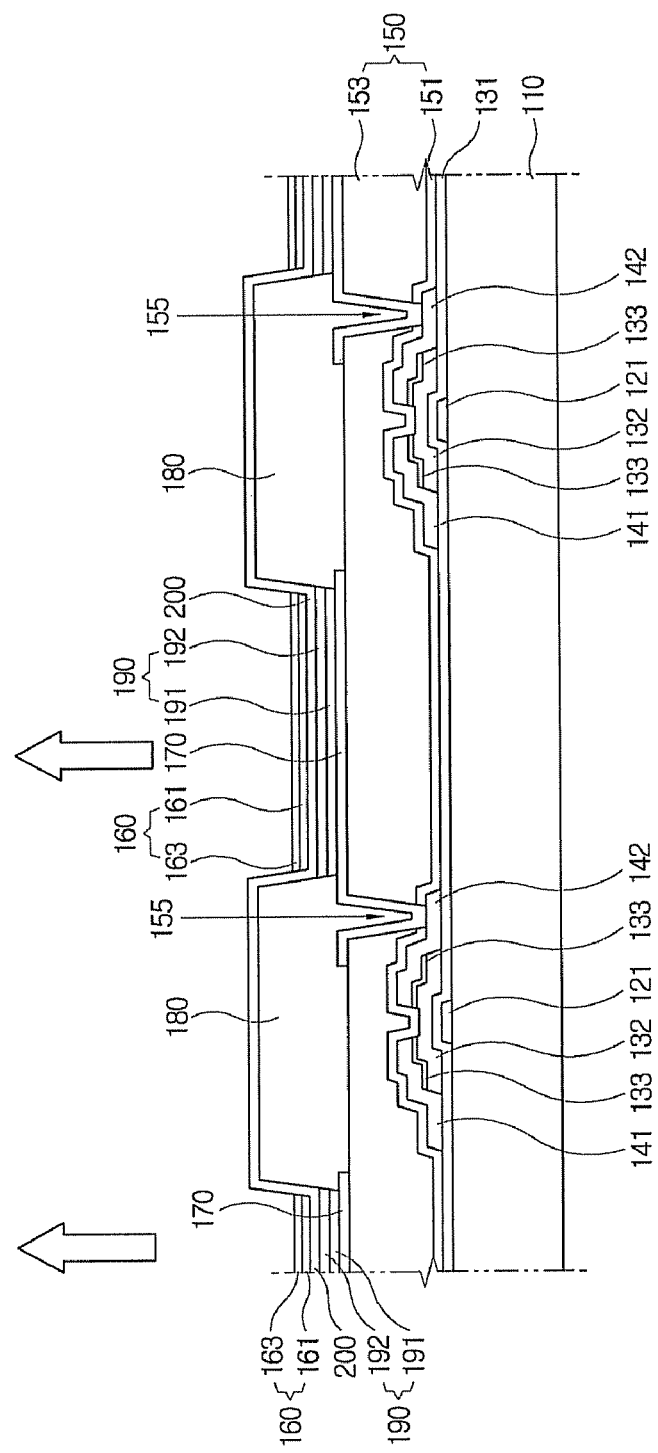

FIG. 5 is a cross-sectional view of a third exemplary embodiment of an OLED display according to the present invention. The third exemplary embodiment of an OLED is top-emission type display as has been described above. A light efficiency improving layer 160 may be disposed on a common electrode 200 between walls 180. In such an exemplary embodiment, a pixel electrode 170 may be made of an opaque material, although alternative exemplary embodiments include configurations wherein the pixel electrode 170 is made of a transparent material, and the common electrode 200 is made of a transparent material.

Figure 6:
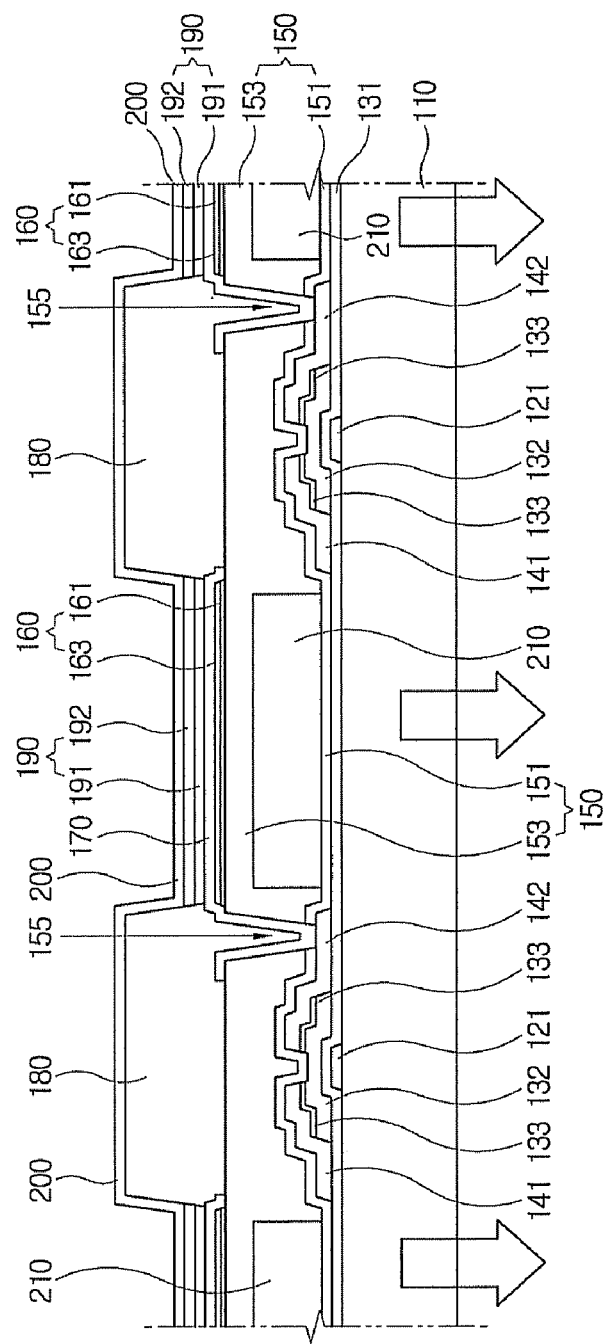

FIG. 6 is a cross-sectional view of a fourth exemplary embodiment of an OLED display according to the present invention. The fourth exemplary embodiment of an OLED display is bottom-emission type display as has been described above. A light efficiency improving layer 160 is disposed between an organic passivation layer 153 and a pixel electrode 170, similar to the first exemplary embodiment. In the fourth exemplary embodiment, however, an organic light emitting layer 192 in the OLED emits white light. Therefore, in order to produce a color display, a color filter layer 210 is disposed between an inorganic passivation layer 151 and the organic passivation layer 153. In such an exemplary embodiment the color filter layer 210 at least partially overlaps an organic layer 190. The unwanted colors are filtered from the white light generated from the organic light emitting layer 192 while the light passes through the color filter layer 210.

In the fourth exemplary embodiment, the organic light emitting layer 192 includes a polymer. In one exemplary embodiment, the organic light emitting layer 192 is formed between walls 180 by ink-jetting. However, alternative exemplary embodiments include configurations wherein the organic light emitting layer 192 includes a low molecular weight material, and in such an exemplary embodiment the light emitting layer 192 is formed on substantially the entire surface of an insulating substrate 110 by a method such as evaporation.

The color filter layer 210 comprises a red color filter layer, a green color filter layer and a blue color filter layer. The light efficiency improving layer 160 may be divided into different sections corresponding to the red, green and blue color filters 210. Each of the different sections may have a different thickness. Furthermore, in one exemplary embodiment, at least one section of the light efficiency improving layer 160 among the three sections corresponding to the red, green and blue organic light emitting layers 192 may have a different sized area. That is, each of the three sections of the light efficiency improving layer 160 corresponding to the three colors may have three different thicknesses or areas from those of the other one portion or two portions. Alternative exemplary embodiments include configurations wherein only one or two of the three sections of the light efficiency improving layer 160 have different thicknesses or areas from those of the other portions.

Figure 7:
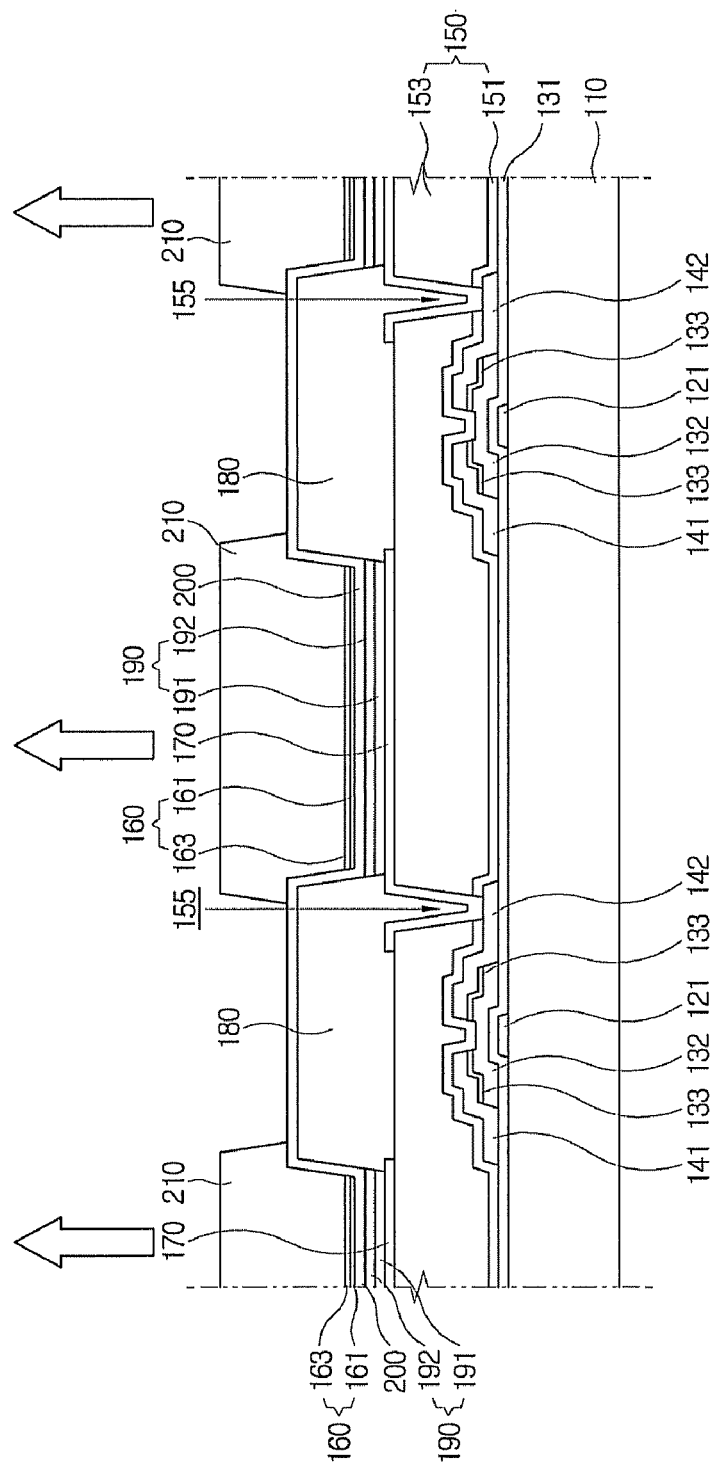

FIG. 7 is a cross-sectional view of fifth exemplary embodiment of an OLED display according to the present invention. The fifth exemplary embodiment of an OLED is top-emission type display as has been described above. A light efficiency improving layer 160 may be disposed on a common electrode 200 between walls 180 similar to the third exemplary embodiment. Similar to the fourth exemplary embodiment, an organic light emitting layer 192 in the OLED emits white light. Therefore, a color filter layer 210 is formed on the light efficiency improving layer 160. The fifth exemplary embodiment of an OLED display has a different configuration from the fourth exemplary embodiment, but uses substantially the same driving and image forming methods as the fourth exemplary embodiment due to the fifth exemplary embodiments requirement of a color filter to display colors.

Figure 8:
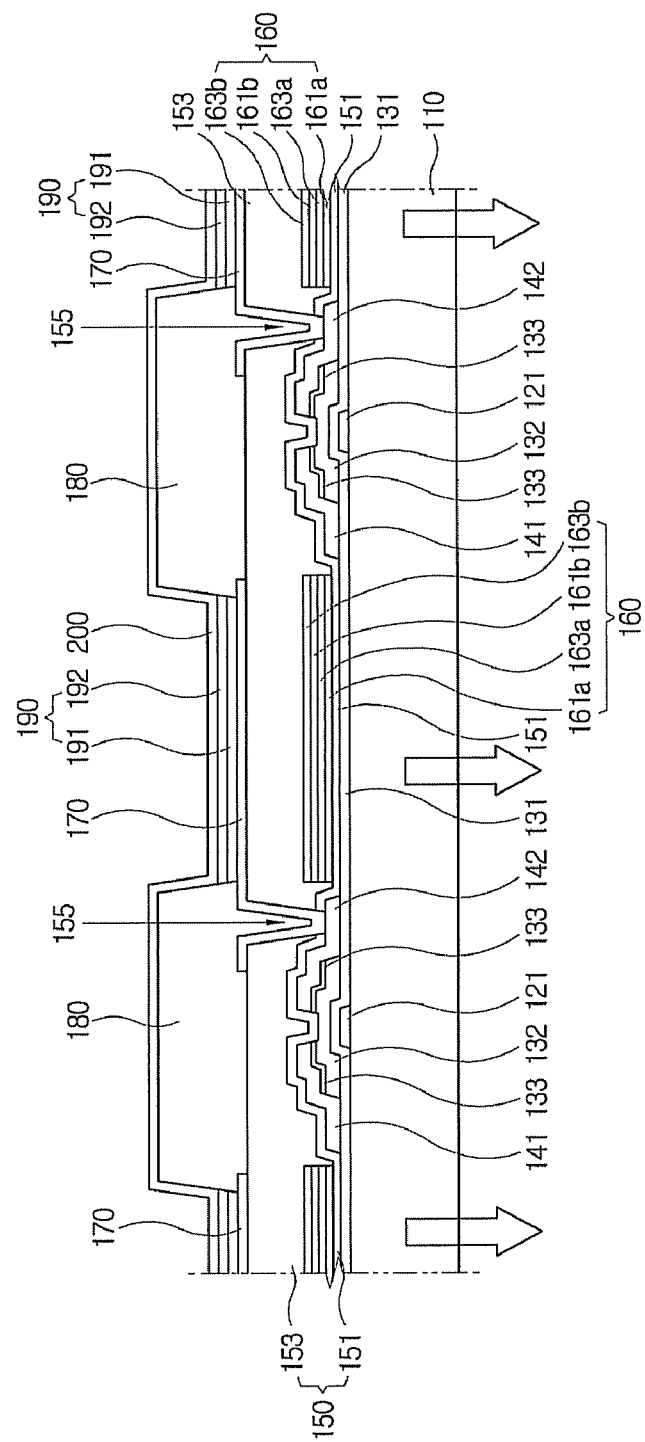

FIG. 8 is a cross-sectional view of a sixth exemplary embodiment of an OLED display according to the present invention. A light efficiency improving layer 160 is disposed between an organic passivation layer 153 and an inorganic passivation layer 151 and includes multiple layers. That is the light efficiency improving layer 160 includes a first inorganic layer 161a, a second inorganic layer 163a, a first inorganic layer 161b and a second inorganic layer 163b which are sequentially formed on the inorganic passivation layer 151. In one exemplary embodiment the light efficiency improving layer 160 includes at least one layer which includes silicon oxide.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:
   a transistor disposed on a substrate;
   a passivation layer which substantially covers the transistor;
   a pixel electrode formed on the passivation layer;
   a wall which divides the pixel electrodes;
   an organic layer formed on the pixel electrode between the walls;
   a common electrode which substantially covers the organic layer and the wall;
   a light efficiency improving layer including a first inorganic layer and a second inorganic layer which are sequentially disposed on an upper surface of the common electrode between the walls; and
   a color filter layer disposed on the light efficiency improving layer.

2. The display device according to claim 1 wherein the second inorganic layer has a higher refractivity than the first inorganic layer.

3. The display device according to claim 1, wherein at least one of the first inorganic layer and the second inorganic layer comprises multiple layers.

4. The display device according to claim 1, wherein the first inorganic layer and the second inorganic layer contact each other, and the first inorganic layer comprises silicon oxide and the second inorganic layer comprises silicon nitride.

5. The display device according to claim 1, wherein the organic layer emits white light.

6. The display device according to claim 1, wherein the color filter layer comprises a red color filter layer, a green color filter layer and a blue color filter layer, and at least one portion of the light efficiency improving layer comprises a plurality of sections corresponding to the red, green and blue organic light emitting layers, respectively, and at least one of the plurality of sections has a thickness which differs from the other sections.

7. The display device according to claim 1, wherein the color filter layer comprises a red color filter layer, a green color filter layer and a blue color filter layer, and at least one portion of the light efficiency improving layer comprises a plurality of sections corresponding to the red, green and blue organic light emitting layers, respectively, and at least one of the plurality of sections covers a different sized area.

* * * * *